(12) United States Patent
Lee

(10) Patent No.: US 10,692,931 B2
(45) Date of Patent: Jun. 23, 2020

(54) ELECTRONIC DEVICE AND METHOD FOR FABRICATING THE SAME

(71) Applicant: SK hynix Inc., Icheon (KR)

(72) Inventor: Hyung Suk Lee, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/109,268

(22) Filed: Aug. 22, 2018

(65) Prior Publication Data
US 2019/0189691 A1 Jun. 20, 2019

(30) Foreign Application Priority Data
Dec. 14, 2017 (KR) .................. 10-2017-0172080

(51) Int. Cl.
| | | |
|---|---|---|
| H01L 27/24 | (2006.01) | |
| H01L 23/36 | (2006.01) | |
| H01L 27/22 | (2006.01) | |
| H01L 45/00 | (2006.01) | |
| H01L 23/34 | (2006.01) | |

(52) U.S. Cl.
CPC .......... *H01L 27/2463* (2013.01); *H01L 23/36* (2013.01); *H01L 27/224* (2013.01); *H01L 27/2409* (2013.01); *H01L 27/2427* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01); *H01L 23/34* (2013.01); *H01L 27/2418* (2013.01)

(58) Field of Classification Search
CPC ..................................................... H01L 27/115
See application file for complete search history.

(56) References Cited

U.S. PATENT DOCUMENTS

| | | | |
|---|---|---|---|
| 6,972,429 B1 | 12/2005 | Hsueh et al. | |
| 2014/0175368 A1* | 6/2014 | Kim ........................ | H01L 45/06 257/4 |
| 2015/0200368 A1* | 7/2015 | Lee ........................ | H01L 45/06 438/382 |

FOREIGN PATENT DOCUMENTS

| | | |
|---|---|---|
| KR | 10-2014-0083560 A | 7/2014 |
| KR | 10-2015-0085155 A | 7/2015 |

* cited by examiner

*Primary Examiner* — Moazzam Hossain
*Assistant Examiner* — Hajar Kolahdouzan

(57) ABSTRACT

An electronic device includes a semiconductor memory. The semiconductor memory includes stack structures, a gap-fill layer filling spaces between the stack structures, and nanopores located in the gap-fill layer. Each of the stack structures includes a memory pattern. The nanopores are distributed in a portion of the gap-fill layer that is located at a level corresponding to where the memory pattern is located in each of the stack structures.

17 Claims, 7 Drawing Sheets

ELECTRONIC DEVICE AND METHOD FOR FABRICATING THE SAME

CROSS-REFERENCE TO RELATED APPLICATION

The present application claims priority under 35 U.S.C. § 119(a) to Korean patent application number 10-2017-0172080, filed on Dec. 14, 2017, which is herein incorporated by reference in its entirety.

BACKGROUND

1. Field of Invention

Embodiments of the present disclosure relate to a memory circuit or a memory device, and an application thereof in an electronic device.

2. Description of the Related Art

Recently, as electronic devices trend toward miniaturization, low power consumption, high performance, multi-functionality, and so on, semiconductor devices capable of storing information in various electronic appliances, such as computers, portable communication devices, and so on, have been demanded in the art. Thus, research for the development of such semiconductor devices has been conducted. Such semiconductor devices include semiconductor devices that can store data by switching between different resistance states according to an applied voltage or current. Examples of the semiconductor devices are a resistive random access memory (RRAM), a phase change random access memory (PRAM), a ferroelectric random access memory (FRAM), a magnetic random access memory (MRAM), an E-fuse, and the like.

SUMMARY

Embodiments of the present disclosure provide an electronic device capable of improving the operational characteristics and reliability of memory cells and a method for fabricating the electronic device.

According to an aspect of the present disclosure, there is provided a method for fabricating an electronic device including a semiconductor memory, the method including: forming stack structures, each of the stack structures including a memory pattern; forming a gap-fill layer that fills spaces between the stack structures; and forming nanopores that are distributed in the gap-fill layer by injecting an inert gas into the gap-fill layer.

According to an aspect of the present disclosure, there is provided a method for fabricating an electronic device including a semiconductor memory, the method including: forming stack structures, each of the stack structures including a variable resistance element; forming a gap-fill layer that fills spaces between the stack structures; and forming, in the gap-fill layer, nanopores that are distributed in a portion of the gap-fill layer, the portion of the gap-fill layer being located at a level corresponding to where the variable resistance element is located in the stack structure.

According to an aspect of the present disclosure, there is provided an electronic device including a semiconductor memory, wherein the semiconductor memory includes: stack structures, each of the stack structures including a memory pattern; a gap-fill layer filling spaces between the stack structures; and nanopores located in the gap-fill layer, the nanopores being distributed in a portion of the gap-fill layer that is located at a level corresponding to where the memory pattern is located in each of the stack structures.

DETAILED DESCRIPTION

Figure 1A:
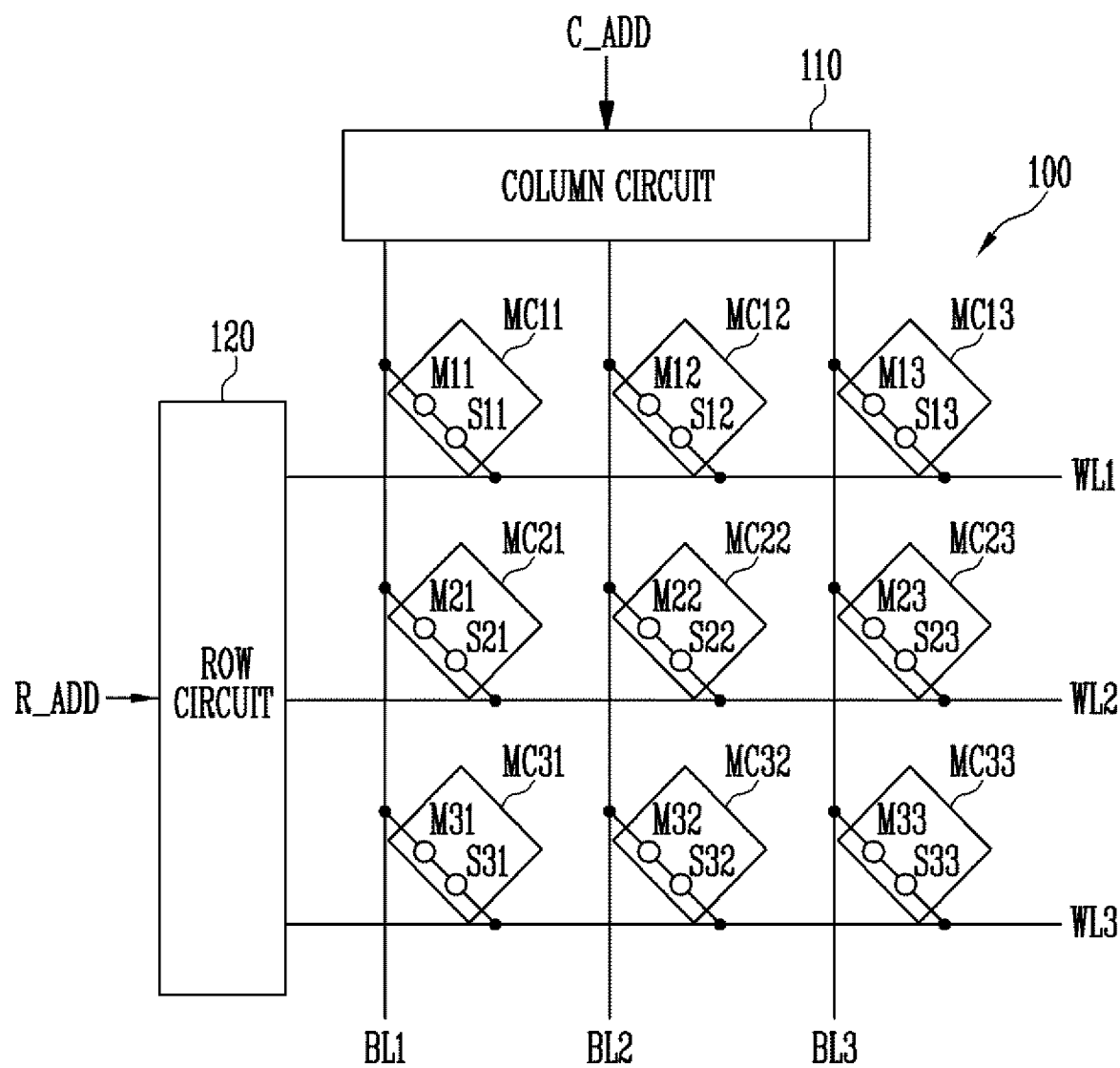
FIGS. 1A and 1B are views illustrating a structure of an electronic device according to an embodiment of the present disclosure.

Hereinafter, various embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale, and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
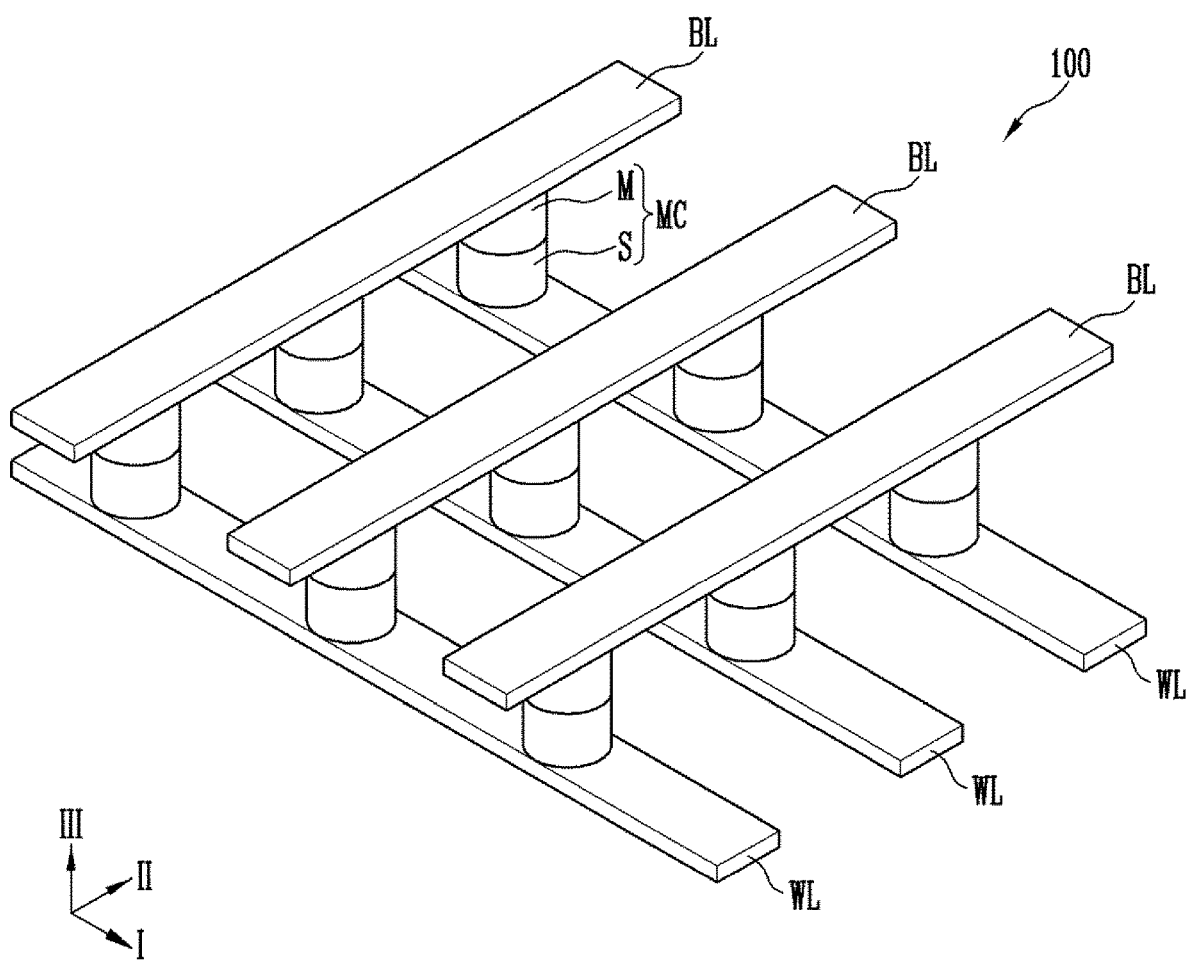

FIGS. 1A and 1B are views illustrating a structure of an electronic device according to an embodiment of the present disclosure. FIG. 1A illustrates a circuit diagram of a memory cell array, and FIG. 1B illustrates a perspective view of the memory cell array of FIG. 1A.

Referring to FIG. 1A, the electronic device according to the embodiment of the present disclosure may include a semiconductor memory, and the semiconductor memory may include row lines and column lines intersecting the row lines. Here, the row lines may be word lines WL and the column lines may be bit lines BL. The word lines WL and the bit lines BL are relative concepts. Therefore, in another embodiment, the row lines may be bit lines BL and the column lines may be word lines WL. In FIG. 1A, it is assumed that the row lines are word lines WL1 to WL3 and the column lines are bit lines BL1 to BL3.

The semiconductor memory may include a memory cell array 100 that includes memory cells MC11 to MC33 respectively disposed between the column lines BL1 to BL3 and the row lines WL1 to WL3. Here, the memory cells MC11 to MC33 may be disposed at intersections of the column lines BL1 to BL3 and the row lines WL1 to WL3. The memory cells MC11 to MC33 include selection elements S11 to S33 and memory elements M11 to M33, which are connected in series to each other, respectively. The selection elements S11 to S33 may be electrically connected to the row lines WL1 to WL3, and the memory elements M11 to M33 may be electrically connected to the column lines BL1 to BL3.

Each of the memory elements M11 to M33 may include a memory pattern as a storage node for storing data. For example, each of the memory elements M11 to M33 may include a variable resistance material such as a resistive material, a magnetic tunnel junction (MTJ), or a phase change material. Each of the selection elements S11 to S33 is used to select a corresponding memory cell MC, and may include a switching material. Each of the selection elements S11 to S33 may be a diode, a PNP diode, a BJT, a Metal Insulator Transition (MIT) element, a Mixed Ionic-Electronic Conduction (MIEC) element, an Ovonic Threshold Switching (OST) element, or the like. The shape and configuration of each of the memory cells MC11 to MC33 may be variously modified according to embodiments.

In an embodiment, the selection elements S11 to S33 may be omitted. In another embodiment, the positions of the selection elements S11 to S33 and the memory elements M11 to M33 may be reversed. That is, the selection elements S11 to S33 may be connected to the column lines BL1 to BL3, and the memory elements M11 to M33 may be connected to the row lines WL1 to WL3.

In addition, the semiconductor memory may further include a column circuit 110 for controlling the column lines BL1 to BL3 and a row circuit 120 for controlling the row lines WL1 to WL3.

The row circuit 120 may be a row decoder, a word line decoder, a word line driver, or the like. For example, the row circuit 120 may select the row line WL2 among the row lines WL1 to WL3 based on a row address R_ADD. The column circuit 110 may be a column decoder, a bit line decoder, a bit line driver, or the like. For example, the column circuit 110 may select the column line BL2 among the column lines BL1 to BL3 based on a column address C_ADD. Thus, the memory cell MC22 connected between the selected column line BL2 and the selected row line WL2 can be selected based on the row address R_ADD and the column address C_ADD.

For illustrative convenience, FIG. 1A shows three column lines BL1 to BL3 and three row lines WL1 to WL3. However, embodiments of the present disclosure are not limited thereto. The numbers of column lines and row lines that are included in a memory cell array in an embodiment of the present disclosure, may be changed, if necessary.

Referring to FIG. 1B, the memory cell array 100 may include column lines BL and row lines WL, which are located at different levels. For example, the column lines BL may be located over the row lines WL. In addition, the row lines WL may extend in parallel to one another along a first direction I, and the column lines BL may extend in parallel to one another along a second direction II intersecting the first direction I.

Memory cells MC may be disposed at intersections of the column lines BL and the row lines WL, and be arranged in a matrix form. Also, each of the memory cells MC may have a stack structure, such as a memory element M and a selection element S that are stacked in a third direction III. The third direction III is perpendicular to the first and second directions I and II.

FIG. 1B illustrates the memory cell array 100 that has a single-deck structure, but embodiments are not limited thereto. In another embodiment, memory cells MC may be stacked in the third direction III. For example, the memory cell array 100 may have a multi-deck structure in which row lines WL and column lines BL are alternately stacked in the third direction III and memory cells MC are disposed between the alternately stacked row lines WL and column lines BL, as illustrated in FIG. 1B.

Meanwhile, although not shown in the drawing, an insulating material may fill spaces between adjacent memory cells MC, between adjacent row lines WL, and between adjacent column lines BL. In addition, nanopores may be present in the insulating material, and may function as heat shield structures. For example, the nanopores may be located between adjacent memory cells, between adjacent memory patterns, or a combination thereof.

Figure 2A:
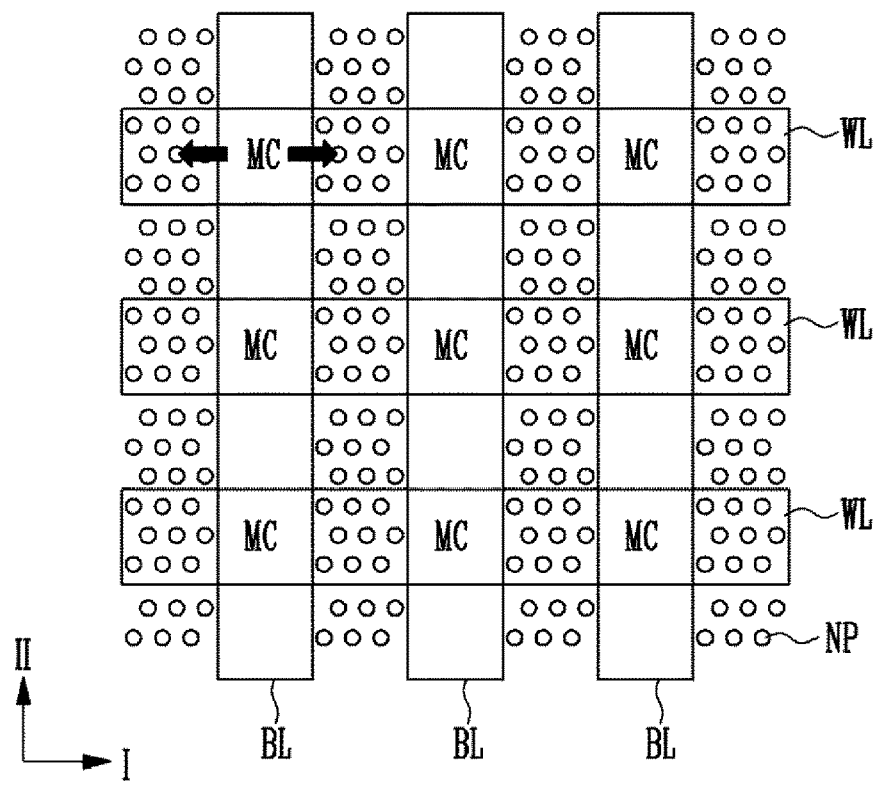
FIGS. 2A to 2C are views illustrating a structure of an electronic device according to an embodiment of the present disclosure.
Figure 2B:
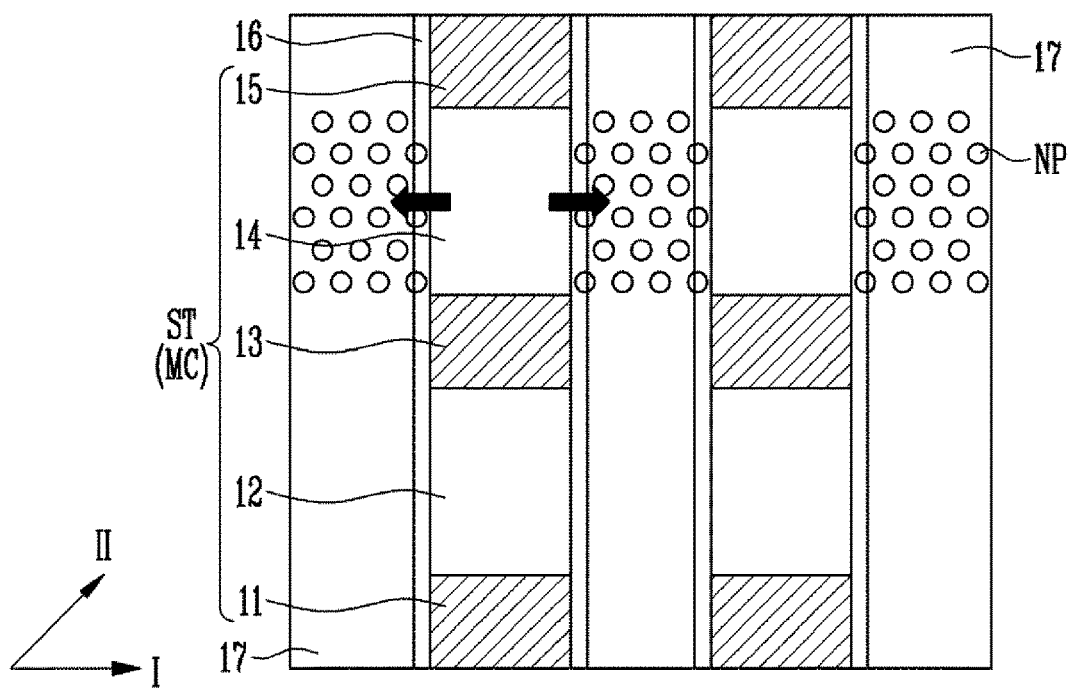
Figure 2C:
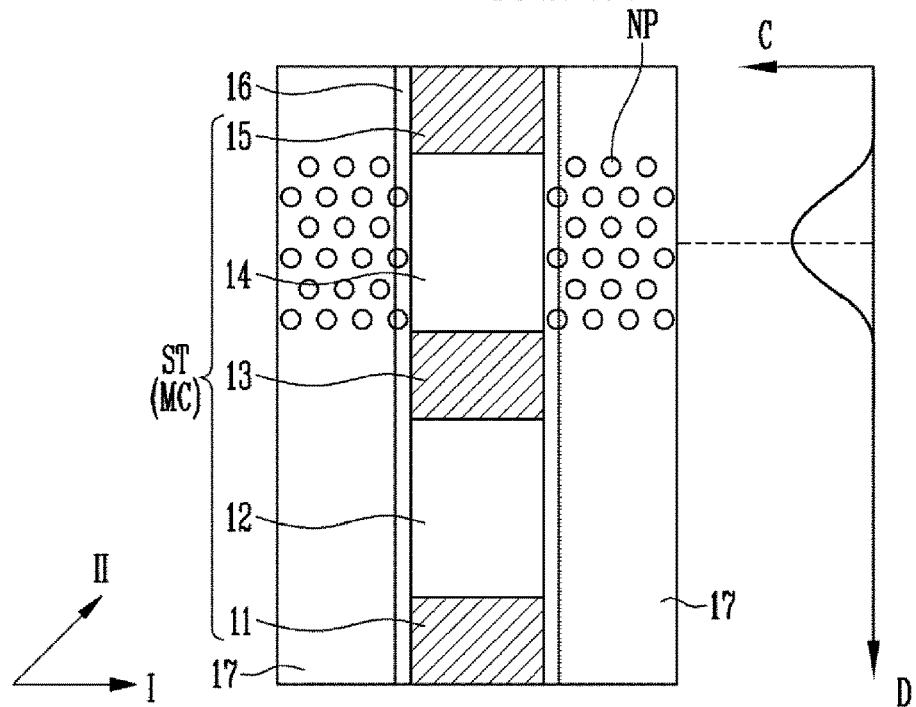

FIGS. 2A to 2C are views illustrating a structure of an electronic device according to an embodiment of the present disclosure. FIG. 2A is a layout, FIG. 2B is a cross-sectional view of FIG. 2A in a first direction I, and FIG. 2C illustrates a cross-sectional view of FIG. 2A in the first direction I and a graph.

Referring to FIG. 2A, nanopores NP are located in an insulating material layer disposed between adjacent memory cells MC. For example, the nanopores NP may be located between pairs of memory cells MC that are adjacent to each other in the first direction I. Also, the nanopores NP may be distributed and arranged in a region in the form of line extending in a second direction II that is perpendicular to the first direction I.

Referring to FIG. 2B, each of the memory cells MC may include a stack structure ST, and the stack structures ST may be located at intersections of row lines WL and column lines BL, which are described above with reference to FIG. 1B. In addition, protective layers 16 may be formed on sidewalls of the stack structures ST, and gap-fill layers 17 may fill spaces between the stack structures ST.

Each of the stack structures ST may include a lower electrode 11, a switching element 12, an intermediate electrode 13, a variable resistance element 14, and an upper electrode 15, which are sequentially stacked.

The variable resistance element 14 has a characteristic that enables it to switch between different resistance states according to an applied voltage or current, and to store data based on a set resistance state. For example, when the variable resistance element 14 has a low resistance state, data '1' may be stored therein. When the variable resistance element 14 has a high resistance state, data '0' may be stored therein. However, embodiments are not limited thereto. In another embodiment, when the variable resistance element 14 has the low resistance state, data '0' may be stored therein. When the variable resistance element 14 has the high resistance state, data '1' may be stored therein.

When the variable resistance element 14 includes a resistive material, the variable resistance element 14 may include a transition metal oxide; a metal oxide, such as a perovskite-based material; or a combination thereof. Therefore, an electrical path may be generated or disappear in the variable resistance element 14, thereby storing data in the variable resistance element 14.

When the variable resistance element 14 has an MTJ structure, the variable resistance element 14 may include a magnetization fixed layer, a magnetization free layer, and a tunnel barrier layer interposed between the magnetization fixed layer and the magnetization free layer. For example, the magnetization fixed layer and the magnetization free layer may include a magnetic material, and the tunnel barrier layer may include a metal oxide including magnesium (Mg), aluminum (Al), zinc (Zn), titanium (Ti), or the like. Here, a magnetization direction of the magnetization free layer may be changed by the spin torque of electrons in an applied current. Therefore, data may be stored in the variable resistance element 14 based on a change in the magnetization direction of the magnetization free layer with respect to a magnetization direction of the magnetization fixed layer.

When the variable resistance element 14 includes a phase change material, the variable resistance element 14 may include a chalcogenide-based material. The variable resistance element 14 may include, in the chalcogenide-based material, silicon (Si), germanium (Ge), antimony (Sb), tellurium (Te), bismuth (Bi), indium (In), tin (Sn), selenium (Se), or the like, or any combination thereof. For example, the variable resistance element 14 may be Ge—Sb—Te (GST), such as $Ge_2Sb_2Te_5$, $Ge_2Sb_2Te_7$, $Ge_1Sb_2Te_4$, $Ge_1Sb_4Te_7$, or the like. Here, the variable resistance element 14 may include a specific chemical composition ratio of material(s), which can be determined by considering properties such as a melting point and a crystallization temperature of the materials. The variable resistance element 14 may further include an impurity such as carbon (C) or nitrogen (N). The phase change material has a low-resistance property in a crystalline state and has a high-resistance property in a non-crystalline or amorphous state. Therefore, data may be stored in the variable resistance element 14 by performing a set operation, in which a resistance state of the variable resistance element 14 is switched from a high-resistance amorphous state to a low-resistance crystalline state; and by performing a reset operation, in which the resistance state of the variable resistance element 14 is switched from the low-resistance crystalline state to the high-resistance amorphous state.

The switching element 12 may be a selection element that controls a current flow through the switching element 12 according to the magnitude of an applied voltage or current. For example, the switching element 12 may substantially prevent a current from flowing therein when the magnitude of the applied voltage or current is equal to or smaller than a predetermined critical value, and allow a current flowing therein to rapidly increase in substantially proportion to the magnitude of the applied voltage or current when the magnitude of the applied voltage or current exceeds the predetermined critical value.

When the switching element 12 is a Metal Insulator Transition (MIT) element, the switching element 12 may include any of $VO_2$, $NbO_2$, $TiO_2$, $WO_2$, $TiO_2$, etc. When the switching element 12 is a Mixed Ion-Electron Conducting (MIEC) element, the switching element 12 may include any of $ZrO_2(Y_2O_3)$, $Bi_2O_3$—BaO, $(La_2O_3)(CeO_2)_{1-x}$, etc. Also, when the switching element 12 is an Ovonic Threshold Switching (OST) element, the switching element 12 may include a chalgonide-based material such as $As_2Te_3$, $As_2$, $As_2Se_3$, or the like.

The lower electrode 11 may be electrically connected to a row line, the intermediate electrode 13 may be interposed between the switching element 12 and the variable resistance element 14, and the upper electrode 15 may be electrically connected to a column line. The lower electrode 11, the intermediate electrode 13, and the upper electrode 15 may include a conductive material, such as a metal or a metal oxide. For example, each of the lower electrode 11, the intermediate electrode 13, and the upper electrode 15 may include any of tungsten (W), tungsten nitride (WN), tungsten silicide (WSi), titanium (Ti), titanium nitride (WNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), etc.

Each of the lower electrode 11, the intermediate electrode 13, and the upper electrode 15 may have a single- or multi-layered structure. Also, the lower electrode 11, the intermediate electrode 13, and the upper electrode 15 may have substantially the same thickness or have different thicknesses. For example, the upper electrode 15 may have a smaller thickness than the lower electrode 11 and the intermediate electrode 13.

Here, upper and lower portions of each of the stack structures ST may have a same width or have different widths. For example, each of the stack structures ST may have a structure with a width that increases toward the lower portion of the structure from the upper portion of the structure. That is, the width of each of the stack structures ST decreases along an upward direction. Thus, the lower electrode 11 and the switching element 12 may have a greater width than the intermediate electrode 13, the variable resistance element 14, and the upper electrode 15. Also, a sidewall of the stack structure ST may have a step shape.

In other embodiments, the shape and configuration of the stack structure ST may be variously modified. For example, at least one of the lower electrode 11, the intermediate electrode 13, and the upper electrode 15 may be omitted. Alternatively, one or more layers (not shown) for enhancing characteristics of the memory cell MC and/or improving efficiency of fabricating processes may be additionally provided between the layers 11 to 15 included in the stack structure ST.

The protective layers 16 are used to protect the stack structures ST in a fabricating process of the electronic device, and may be formed on the sidewalls of the stack structures ST. Here, the protective layer 16 may include a non-conductive material, and include any of an oxide, a nitride, poly-silicon, etc. For example, the protective layer 16 may include any of silicon oxide ($SiO_x$), silicon nitride ($Si_3N_4$), poly-silicon, titanium nitride (TiN), tantalum nitride (TaN), etc. Also, the protective layer 16 may be in a single layer or in multiple layers, i.e., a multi-layer structure.

In addition, the gap-fill layer 17 may be located between pairs of stack structures ST that are adjacent to each other in the first direction I. The gap-fill layer 17 may include a material having an etch selectivity that is higher than that of the protective layer 16, and include an insulating material such as an oxide. For example, the gap-fill layer 17 may be an oxide layer, such as a silicon oxide ($SiO_2$) layer; a flowable oxide layer, such as a Spin On Coating (SOC) layer or a Spin On Dielectric (SOD) layer; or a combination thereof.

The gap-fill layer 17 may include nanopores NP therein. Here, the nanopores NP are empty spaces having a relatively small size as compared with typical air gaps. For example, the nanopore NP may be an empty space having a relatively small size, e.g., a diameter, of a few nanometers or less, or be an empty space having a relatively small size, e.g., a diameter of a few to a few tens of nanometers. For example, each of the nanopores NP may have a diameter of 1 to 100 nanometers. Therefore, the gap-fill layer 17 may be a porous layer including nano-size pores. Also, the nanopores NP may include any of air, an inert gas, etc. The inert gas may include any of hydrogen gas, helium gas, argon gas, xenon gas, nitrogen gas, etc.

Here, the nanopores NP have a lower thermal conductivity than the insulating material of the gap-fill layer 17. Also, the nanopores NP are distributed to form multiple layers surrounding sidewalls of the memory cells MC. Thus, a thermal insulation characteristic of the gap-fill layer 17 can be enhanced by the nanopores NP, and heat in the memory cell MC can be effectively prevented from being transferred outside or from being lost. In particular, heat generated in a set operation and/or a reset operation of the memory cell MC is prevented from being transferred out of the memory cell MC, so that the energy efficiency of the set operation and/or the reset operation can be increased.

Referring to FIG. 2C, the nanopores NP may be distributed in the entire gap-fill layer 17, or may be intensively located in a specific portion of the gap-fill layer 17. For example, the nanopores NP may be distributed and arranged in only a portion of the gap-fill layer 17 that is located at a given level corresponding to the variable resistance element 14. Therefore, the gap-fill layer 17 may have a porous structure at only the given level corresponding to the variable resistance element 14, and the gap-fill layer 17 may have a dense structure at levels other than the given level. The given level may be defined as a level in a third direction III that is perpendicular to the first and second directions I and II. When the nanopores NP are distributed in a uniform density at the given level of the gap-fill layer 17 that corresponds to the variable resistance element 14, the gap-fill layer 17 has a uniform etching rate at the given level. The distribution form of the nanopores NP may be controlled by adjusting conditions of an ion implantation process, e.g., an ion beam energy, an injection range (Rp) of an ion beam, etc.

The graph of FIG. 2C illustrates a change in the concentration C of the nanopores NP with respect to a depth D in the third direction III. Referring to the graph, the nanopores NP may be located with a Gaussian distribution in the gap-fill layer 17, and may be distributed in the highest concentration at the given level corresponding to the variable resistance element 14. For example, the nanopores NP may be distributed in the highest concentration at the middle of the variable resistance element 14 in the third direction III, have a concentration decreasing in a direction toward the upper electrode 15, and have a concentration decreasing in a direction toward the intermediate electrode 13. Thus, the nanopores NP are intensively disposed at the given level corresponding to the variable resistance element 14, which is a storage node, so that a thermal loss from the storage node can be minimized by the nanopores NP surrounding the storage node, i.e., the variable resistance element 14.

According to the structure described above, the nanopores NP are located between adjacent memory cells MC. The nanopores NP form heat shield structures, and thus can prevent thermal crosstalk from being caused between the adjacent memory cells MC. As a result, the energy efficiency of the set operation and/or the reset operation of the memory cell MC can be increased.

Figure 3A:
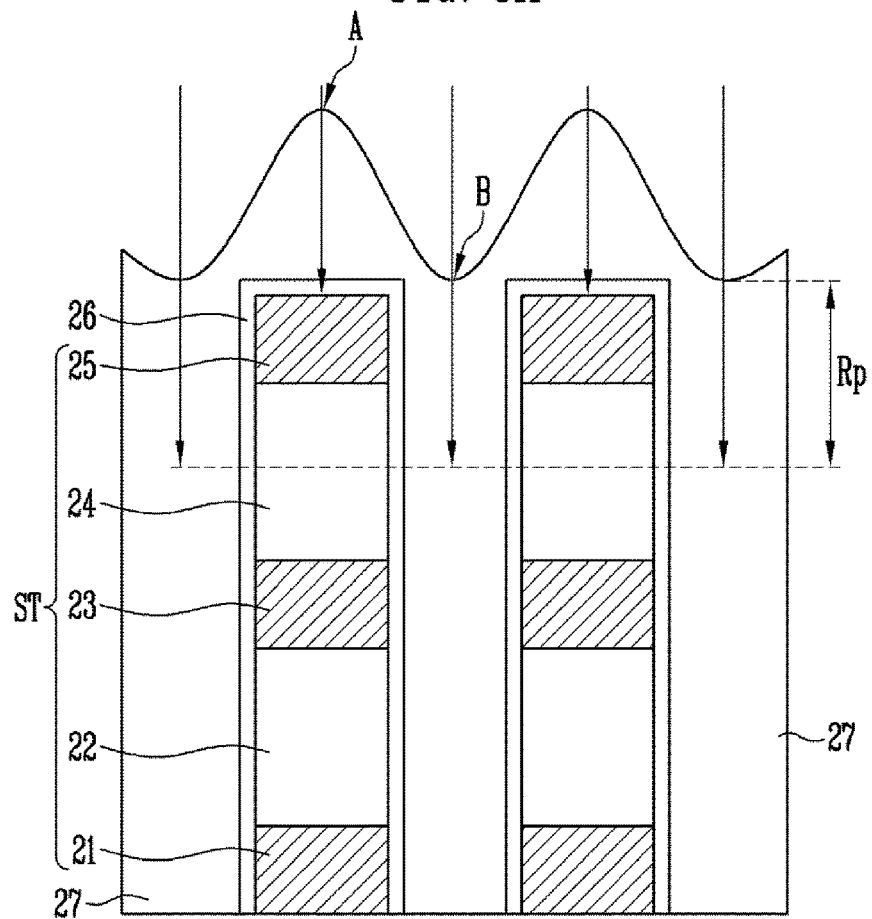
FIGS. 3A to 3C are cross-sectional views illustrating a method for fabricating an electronic device according to an embodiment of the present disclosure.
Figure 3B:
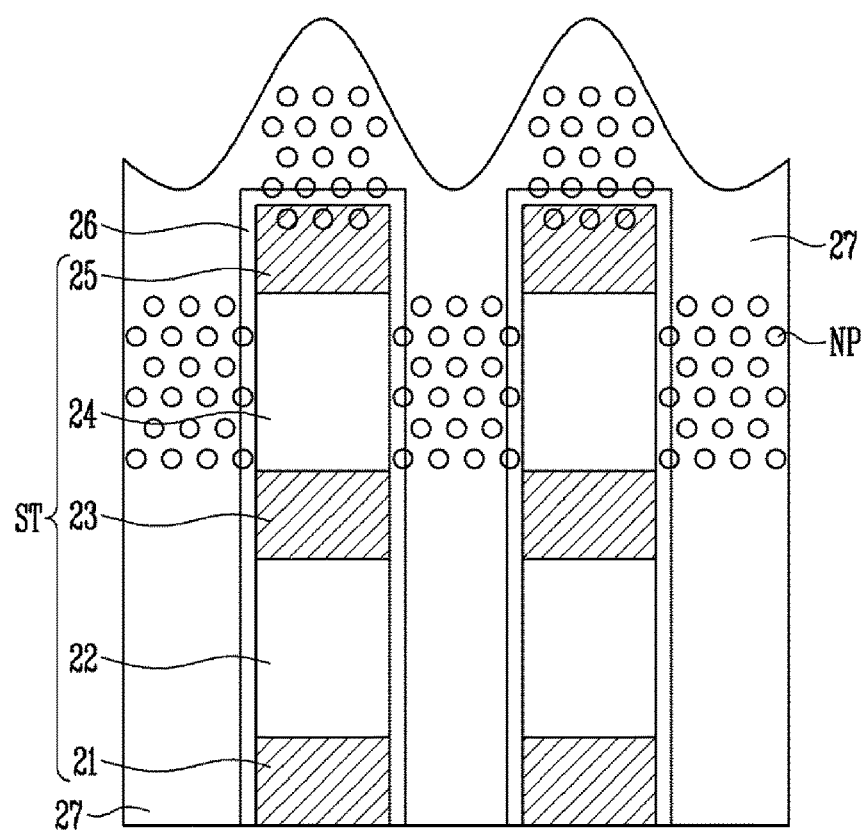
Figure 3C:
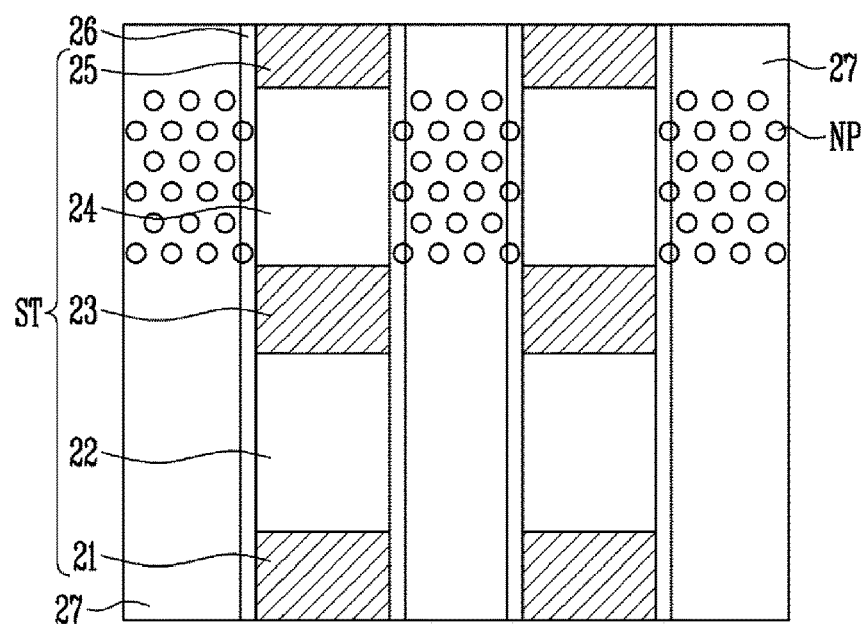

FIGS. 3A to 3C are cross-sectional views illustrating a method for fabricating an electronic device according to an embodiment of the present disclosure.

Referring to FIG. 3A, stack structures ST each including a memory pattern are formed. Each of the stack structures ST may include a lower electrode 21, a switching element 22, an intermediate electrode 23, a variable resistance element 24, and an upper electrode 25, which are sequentially stacked. Here, the variable resistance element 24 corresponds to the memory pattern, and may include any of a resistance change layer, a magnetic tunneling junction layer, a phase change layer, etc. In addition, although not shown in the drawings, each of the stack structures ST may further include a hard mask formed on the upper electrode 25.

For example, after a first conductive layer for row lines, a lower electrode layer, a switching material layer, an intermediate electrode layer, a variable resistance material layer, and an upper electrode layer are sequentially stacked, the stacked layers are patterned in a first direction. Subsequently, after a second conductive layer for column lines is formed, the second conductive layer for column lines, the upper electrode layer, the variable resistance material layer, the intermediate electrode layer, the switching material layer, and the lower electrode layer are patterned in a second direction intersecting the first direction. Accordingly, the row lines, the column lines, and a plurality of stack structures ST are formed. For example, the row lines have a line shape extending in the first direction, and the column lines have a line shape extending in the second direction. The stack structures ST are located in intersection regions of the row and column lines and each have a pillar shape.

Here, the lower electrode layer, the intermediate electrode layer, and the upper electrode layer may be formed to have substantially the same thickness or different thicknesses. For example, the upper electrode layer may be formed to have a thickness greater than those of the lower electrode layer and the intermediate electrode layer, and the thickness of the upper electrode layer may be reduced during a subsequent planarization process.

Subsequently, a protective layer 26 is formed along profiles of the stack structures ST. The protective layer 26 may be formed along top surfaces and sidewalls of the stack structures ST to cover the top surfaces and sidewalls of the stack structures ST.

The protective layer 26 may include any of silicon oxide ($SiO_x$), silicon nitride ($Si_3N_4$), poly-silicon, titanium nitride (TiN), tantalum nitride (TaN), etc. Also, the protective layer 16 may be provided in a single layer or in multiple layers.

Subsequently, a gap-fill layer 27 may be formed to fill a space between adjacent stack structures ST, and may be formed on the protective layer 26. For example, the gap-fill layer 27 may include an oxide such as silicon oxide ($SiO_2$), include a flowable oxide layer such as a Spin On Coating (SOC) layer or a Spin On Dielectric (SOD) layer, or include any combination thereof.

Here, since the gap-fill layer 27 is formed on a resultant structure including the stack structures ST, the gap-fill layer 27 may be formed along surface steps of the resultant structure. Therefore, the gap-fill layer 27 may have a top surface to which a profile of the resultant structure is reflected, and thus may have a non-uniform top surface corresponding to top surfaces of the resultant structure. For example, the top surface of the gap-fill layer 27 may have a relatively high level A on the top of the stack structures ST, and have a relatively low level B on spaces between the stack structures ST.

Subsequently, an inert gas is injected into the gap-fill layer 27. Here, the inert gas may include any of hydrogen (H), helium (He), argon (Ar), xenon (Xe), nitrogen (N), and a combination thereof. For example, the inert gas may be injected using an ion implantation process, and the energy of an ion beam used in the ion implantation process may be about 1 KeV to about 100 KeV. In addition, the inert gas may be injected with a concentration of $1E15/cm^2$ to $1E17/cm^2$.

The inert gas may be injected into a space between adjacent stack structures ST. At this time, a range (Rp) in which the inert gas is injected is controlled, so that the inert gas can be injected to have a high concentration at a depth level corresponding to where the variable resistance element 24 is located in the stack structure ST.

In addition, a region in which the inert gas is injected may be controlled. For example, when nanopores NP are formed only in a space between adjacent stack structures ST, the inert gas is injected only into the space between the adjacent stack structures ST. To inject the inert gas, a separate mask pattern may be used as an ion implantation barrier, or the top surface of the gap-fill layer 27 having a curved shape of several different height or depth levels may be used.

When the gap-fill layer 27 has the curved top surface, the top surface may have the relatively low level B in a space between adjacent stack structures ST. Therefore, the Rp is determined based on the relatively low level B. In this case, since the inert gas is also injected into a portion of the gap-fill layer 27 that is disposed on the stack structures ST as deep as the Rp, it is possible to minimize the injection of the inert gas into the stack structure ST by controlling the Rp. In other embodiments, the inert gas may be further injected into the protective layer 26 or into the upper electrode 25. But, it is possible to prevent the inert gas from being injected into the variable resistance element 24.

Referring to FIG. 3B, nanopores NP may be formed in the gap-fill layer 27. For example, the nanopores NP may be formed by performing a heat treatment process. Here, the heat treatment process may be simultaneously performed while ion-implanting the inert gas, or may be performed by a heat treatment process after the inert gas is ion-implanted. The heat treatment process may be performed at a temperature of a few tens to a few hundreds of ° C. The heat treatment process may not be separately performed. Instead, the nanopores NP may be formed by a heat treatment process that is performed together with a subsequent fabricating process.

The nanopores NP may be formed as ions of the inert gas react with each other. Accordingly, the gap-fill layer 27 includes the nanopores NP that are distributed and arranged around the variable resistance element 24. The thermal conductivity of the gap-fill layer 27 is decreased by the nanopores NP.

The nanopores NP have several distinct advantages over typical air gaps. Since typical air gaps are formed by depositing a gap-fill material using poor step coverage, the air gaps have a relatively large size, and are formed in a specific region. Therefore, if air gaps are exposed in an etching process, a region in which the air gaps are exposed has a high etching rate as compared with a region in which any air gap does not exist, and therefore punching may occur at a portion under the air gap due to a difference in etching rates.

On the other hand, according to the embodiment of the present disclosure, since the nanopores NP are formed as ions of the ion-implanted inert gas react with each other, the nanopores NP have a relatively small size, e.g., a diameter of a few nanometers or less or a diameter of a few to a few tens of nanometers, and may be distributed and arranged in the gap-fill layer 27. Thus, a portion of the gap-fill layer 27 in which the nanopores NP are arranged has a uniform etching rate, and punching is prevented even when the nanopores NP are exposed in an etching process.

For reference, when the inert gas is injected into the upper electrode 25 or the protective layer 26, the nanopores NP may also be formed in the upper electrode 25 or the protective layer 26 as shown in FIG. 3B.

Referring to FIG. 3C, a planarization process, such as a chemical mechanical polishing process, is performed on a resultant structure including the nanopores NP. As an example, the gap-fill layer 27 is planarized until the top surfaces of the stack structures ST are exposed. Accordingly, the nanopores NP formed on the stack structures ST are removed, and portions of the gap-fill layer 27 filling the spaces between the stack structures ST are separated from each other.

In an embodiment, when the nanopores NP are also formed in the upper electrode 25, the planarization process may be performed until the nanopores NP formed in the upper electrode 25 are removed. In other embodiments, the planarization process may be performed until a top surface of the protective layer 26, or a top surface of the upper electrode 25, is exposed.

According to the method described above, as the inert gas is injected using the ion implantation process, the nanopores NP can be easily formed, and the position at which the nanopores NP are formed can also be easily controlled. In addition, as the inert gas is injected using the surface profile of the gap-fill layer 27, it is possible to minimize the implantation of the inert gas into the stack structures ST.

Figure 4:
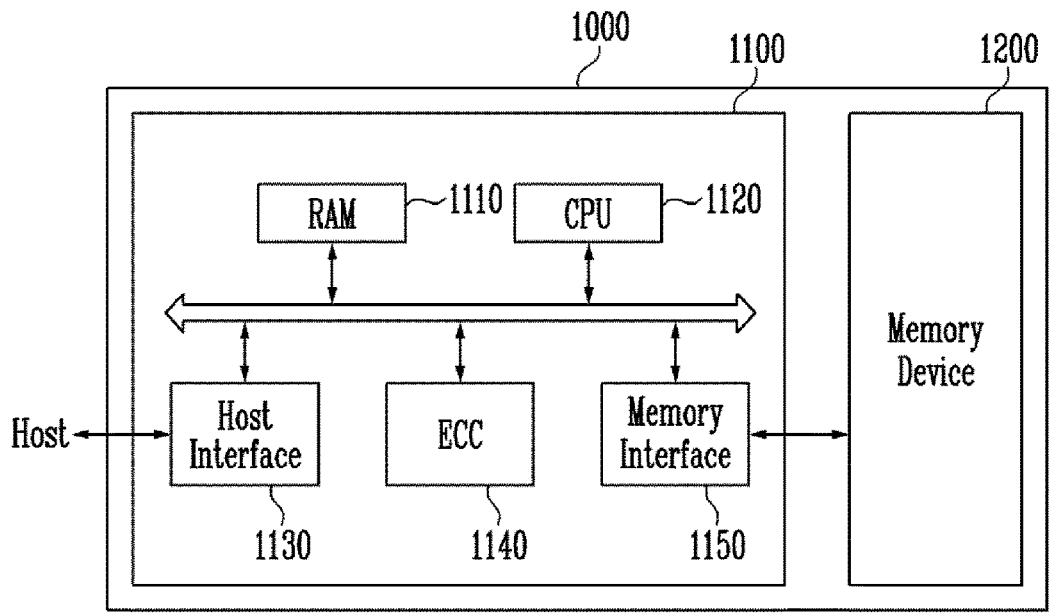
FIGS. 4 and 5 are block diagrams illustrating configurations of memory systems according to embodiments of the present disclosure.

FIG. 4 is a block diagram illustrating a configuration of a memory system 1000 according to an embodiment of the present disclosure.

Referring to FIG. 4, the memory system 1000 according to the embodiment of the present disclosure includes a memory device 1200 and a controller 1100.

The memory device 1200 is used to store data information having various data formats such as texts, graphics, and software codes. The memory device 1200 may be a non-volatile memory. Also, the memory device 1200 may have the structure described with reference to FIGS. 1A to 3C, and be fabricated according to the fabricating method described with reference to FIGS. 1A to 3C. In an embodiment, the memory device 1200 may include: stack structures each including a memory pattern; a gap-fill layer filling spaces between the stack structures; and nanopores located in the gap-fill layer, the nanopores being distributed at only a height or depth level corresponding to where the memory pattern is located in each of the stack structures. The structure and fabricating method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with any of a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial- ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not shown) for temporarily storing data. Here, the buffer memory may be used to temporarily store data to be transferred to the outside through the host interface 1130 or data transferred from the memory device 1200 through the memory interface 1150. The controller 1100 may further include a ROM that stores code data for interfacing with the host.

As described above, the memory system 1000 according to the embodiment of the present disclosure includes the memory device 1200 having an improved degree of integration and improved characteristics, and thus it is possible to improve the degree of integration and characteristics of the memory system 1000.

Figure 5:
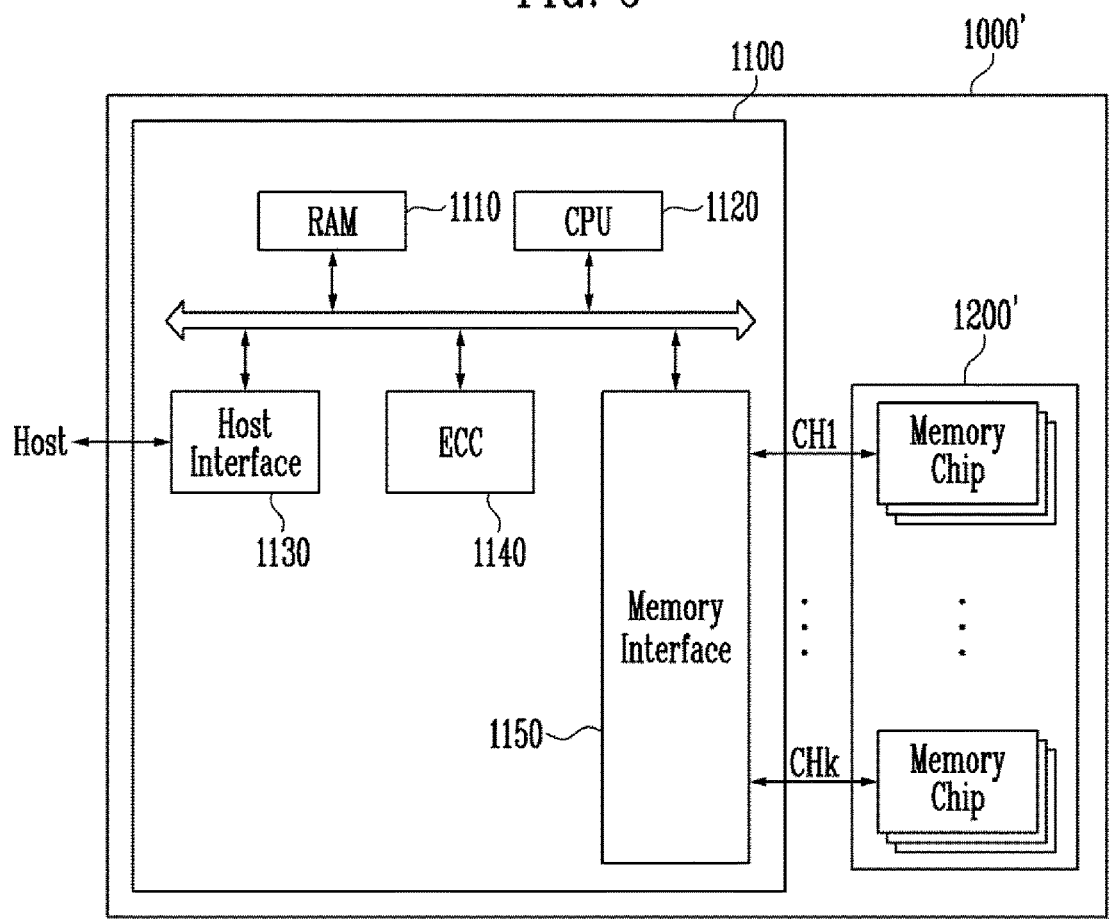

FIG. 5 is a block diagram illustrating a configuration of a memory system 1000' according to an embodiment of the present disclosure. Hereinafter, descriptions of contents overlapping with those described above will be omitted.

Referring to FIG. 5, the memory system 1000' according to the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structure described with reference to FIGS. 1A to 3C, and be fabricated according to the fabricating method described with reference to FIGS. 1A to 3C. In an embodiment, the memory device 1200' may include: stack structures each including a memory pattern; a gap-fill layer filling spaces between the stack structures; and nanopores located in the gap-fill layer, the nanopores being distributed at only a height or depth level corresponding to where the memory pattern is located in each of the stack structures. The structure and fabricating method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 using first to kth channels (CH1 to CHk). In addition, memory chips included in one group may be configured to communicate with the controller 1100 using a common channel. In an embodiment, the memory system 1000' may be modified such that one memory chip is connected to one channel.

As described above, the memory system 1000' according to the embodiment of the present disclosure includes the memory device 1200' having an improved degree of integration and improved characteristics, and thus it is possible to improve the degree of integration and characteristics of the memory system 1000'. Particularly, the memory device 1200' is configured as a multi-chip package, so that it is possible to increase the data storage capacity of the memory system 1000' and to improve the operation speed of the memory system 1000'.

Figure 6:
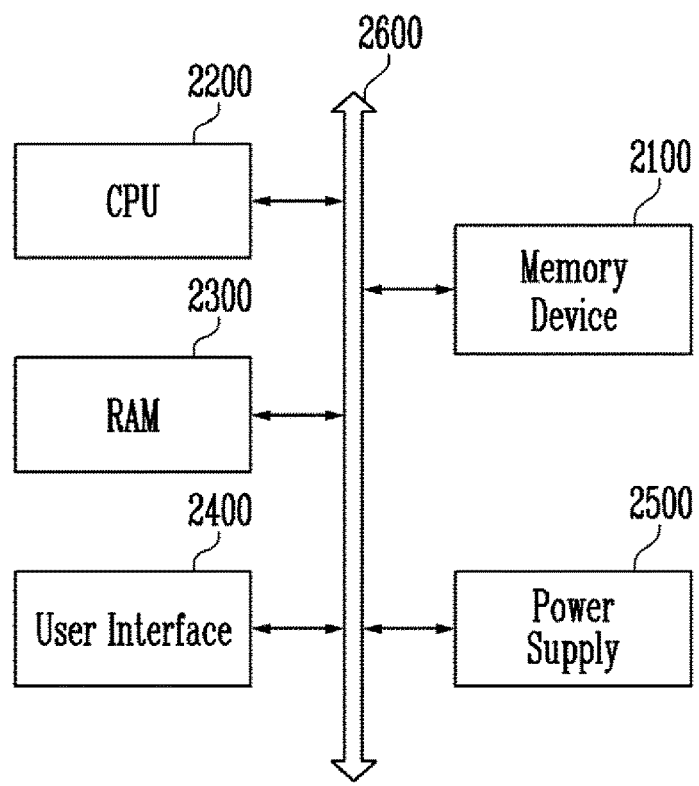
FIGS. 6 and 7 are block diagrams illustrating configurations of computing systems according to embodiments of the present disclosure.

FIG. 6 is a block diagram illustrating a configuration of a computing system 2000 according to an embodiment of the present disclosure. Hereinafter, description of contents overlapping with those described above will be omitted.

Referring to FIG. 6, the computing system 2000 according to the embodiment of the present disclosure includes a memory device 2100, a CPU 2200, a RAM 2300, a user interface 2400, a power source 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

Here, the memory device 2100 may be a nonvolatile memory. Also, the memory device 2100 may have the structure described with reference to FIGS. 1A to 3C, and be fabricated according to the fabricating method described with reference to FIGS. 1A to 3C. In an embodiment, the memory device 2100 may include: stack structures each including a memory pattern; a gap-fill layer filling spaces between the stack structures; and nanopores located in the gap-fill layer, the nanopores being distributed at only a height or depth level corresponding to where the memory pattern is located in each of the stack structures. The structure and fabricating method of the memory device 2100 are the same as described above, and therefore, their detailed descriptions will be omitted.

The memory device 2100 may be a multi-chip package including a plurality of memory chips as described with reference to FIG. 5.

The computing system 2000 configured as described above may be any of a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to the embodiment of the present disclosure includes the memory device 2100 having an improved degree of integration and improved characteristics, and thus it is possible to improve the degree of integration and characteristics of the computing system 2000.

Figure 7:
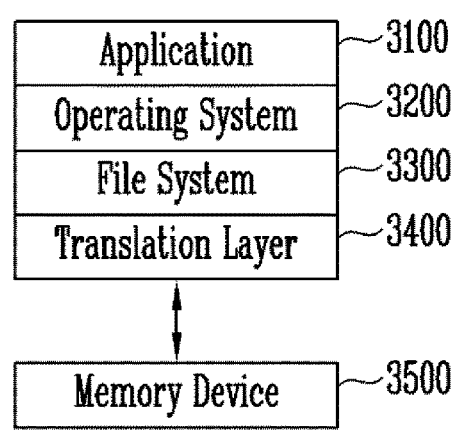

FIG. 7 is a block diagram illustrating a computing system 3000 according to an embodiment of the present disclosure.

Referring to FIG. 7, the computing system 3000 according to the embodiment of the present disclosure includes a software layer including an operating system 3200, an application 3100, a file system 3300, a translation layer 3400, and the like. In addition, the computing system 3000 includes a hardware layer including a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a new technology (NT) file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be any of a flash translation layer (FTL), a universal flash storage link layer (ULL), etc.

The memory device 3500 may be a nonvolatile memory. Also, the memory device 3500 may have the structure described with reference to FIGS. 1A to 3C, and be fabricated according to the fabricating method described with reference to FIGS. 1A to 3C. In an embodiment, the memory device 3500 may include: stack structures each including a memory pattern; a gap-fill layer filling spaces between the stack structures; and nanopores located in the gap-fill layer, the nanopores being distributed at only a height or depth level corresponding to where the memory pattern is located in each of the stack structures. The structure and fabricating method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having an improved degree of integration and improved characteristics, and thus it is possible to improve the degree of integration and characteristics of the computing system 3000.

In the electronic device and the method for fabricating the same according to the present disclosure, operational characteristics and reliability of memory cells can be improved. In particular, it is possible to prevent characteristic degradation of a variable resistance element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory, wherein the semiconductor memory includes:
   stack structures, each of the stack structures including a memory pattern;
   a gap-fill layer filling spaces between the stack structures;
   a protective layer interposed between the stack structures and the gap-fill layer; and
   nanopores located in the gap-fill layer and the protective layer, the nanopores being distributed in a portion of the gap-fill layer and a portion of the protective layer that are located at a level corresponding to where the memory pattern is located in each of the stack structures,
   wherein the gap-fill layer includes a material having an etch selectivity that is higher than that of the protective layer.

2. The electronic device of claim 1, wherein the nanopores surround a sidewall of the memory pattern in multiple layers, and the multiple layers of the nanopores decrease a thermal conductivity of the gap-fill layer.

3. The electronic device of claim 1, wherein the nanopores are generated using a hydrogen gas, a helium gas, an argon gas, a xenon gas, a nitrogen gas, or a combination thereof.

4. The electronic device of claim 1, wherein the memory pattern includes a variable resistance material.

5. The electronic device of claim 1, wherein the gap-fill layer has a porous structure in only a region corresponding to where the memory pattern is located in each of the stack structures.

6. The electronic device of claim 1, wherein a concentration of the nanopores at a level corresponding to a middle portion of the memory pattern is greater than that of the nanopores at a level corresponding to upper and lower portions of the memory pattern, in a stack direction of the stack structures.

7. The electronic device of claim 1, wherein an interface exists between the protective layer and the gap-fill layer.

8. The electronic device of claim 1, wherein the gap-fill layer is spaced apart from the stacked structures.

9. An electronic device comprising a semiconductor memory, wherein the semiconductor memory includes:
   stack structures, each of the stack structures including a first electrode, a second electrode, and a memory pattern interposed between the first electrode and the second electrode;
   a gap-fill layer disposed between the stack structures, wherein the gap-fill layer includes a first potion corresponding to the memory pattern of each of the stack structures and a second portion corresponding to the first and second electrodes of each of the stack structures;

a protective layer interposed between the stack structures and the gap-fill layer; and nanopores distributed in the first portion of the gap-fill layer, wherein the gap-fill layer includes a material having an etch selectivity that is higher than that of the protective layer.

10. The electronic device of claim 9, wherein the nanopores are not distributed in the second portion of the gap-fill layer.

11. The electronic device of claim 9, wherein the nanopores are distributed in a portion of the protective layer.

12. The electronic device of claim 9, wherein the first portion has a porous structure.

13. The electronic device of claim 9, wherein a concentration of the nanopores at a level corresponding to a middle portion of the memory pattern is greater than that of the nanopores at a level corresponding to upper and lower portions of the memory pattern, in a stack direction of the stack structures.

14. The electronic device of claim 9, wherein the nanopores include an inert gas.

15. An electronic device comprising a semiconductor memory, wherein the semiconductor memory includes:
a first stack structure including first electrodes and a first memory pattern interposed between the first electrodes;
a second stack structure including second electrodes and a second memory pattern interposed between the second electrodes;
a gap-fill layer disposed between the first stack structure and the second stack structure;
a protective layer interposed between the first stack structure and the gap-fill layer; and
nanopores distributed in a first portion of the gap-fill layer and in a second portion of the protective layer, the first and second portions being restricted between the first memory pattern and the second memory pattern,
wherein an interface exists between the protective layer and the gap-fill layer.

16. The electronic device of claim 15, wherein the nanopores include an inert gas.

17. The electronic device of claim 15, wherein a concentration of the nanopores at a level corresponding to a middle portion of the first memory pattern is greater than that of the nanopores at a level corresponding to upper and lower portions of the first memory pattern, in a stack direction of the first stack structure.

* * * * *